United States Patent
Chen et al.

(10) Patent No.: US 11,081,621 B2
(45) Date of Patent: Aug. 3, 2021

(54) DISPLAY PANEL

(71) Applicant: CHENGDU VISTAR OPTOELECTRONICS CO., LTD., Sichuan (CN)

(72) Inventors: Huashan Chen, Kunshan Suzhou (CN); Xiaolong Yang, Kunshan Suzhou (CN); Rubo Xing, Kunshan Suzhou (CN); Dong Wei, Kunshan Suzhou (CN); Jiantai Wang, Kunshan Suzhou (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 0 days.

(21) Appl. No.: 16/773,229

(22) Filed: Jan. 27, 2020

(65) Prior Publication Data
US 2020/0161503 A1    May 21, 2020

Related U.S. Application Data

(63) Continuation of application No. PCT/CN2019/084869, filed on Apr. 28, 2019.

(30) Foreign Application Priority Data

Aug. 31, 2018    (CN) .......................... 201811013578.5

(51) Int. Cl.
*H01L 27/00* (2006.01)
*H01L 33/00* (2010.01)
(Continued)

(52) U.S. Cl.
CPC .......... *H01L 33/06* (2013.01); *H01L 27/1214* (2013.01); *H01L 33/50* (2013.01)

(58) Field of Classification Search
CPC . H01L 25/0753; H01L 25/167; H01L 25/048; H01L 27/1214; H01L 27/32;
(Continued)

(56) References Cited

U.S. PATENT DOCUMENTS 7,990,058 B2 * 8/2011 Cok .................... H01L 51/5284
313/506
10,739,502 B2 * 8/2020 Baek ....................... G02B 5/285
(Continued)

FOREIGN PATENT DOCUMENTS

CN        106526947 A      3/2017
CN        107728368 A      2/2018
(Continued)

OTHER PUBLICATIONS

International Search Report for Application No. PCT/CN2019/084869 dated Jul. 25, 2019. (8 pages).

*Primary Examiner* — Nikolay K Yushin
(74) *Attorney, Agent, or Firm* — Maier & Maier, PLLC

(57) ABSTRACT

The present disclosure provides a display panel including a substrate; and a plurality of pixel units arranged on the substrate; wherein each of the plurality of pixel units includes a plurality of sub-pixel units including at least one first type of sub-pixel unit; each of the plurality of sub-pixel units includes a light emitting layer; the at least one first type of sub-pixel unit includes a first light processing layer; the first light processing layer includes at least a light diffusion material and a light conversion material mixed with each other; and the first light processing layer is located on a side of a light emitting surface of the light emitting layer at the at least one first type of sub-pixel unit. By the above-mentioned manner, the uniformity of light conversion by the light emitting layer may be improved, thereby the display effect of the display panel may be improved.

18 Claims, 2 Drawing Sheets

(51) Int. Cl.
*H01L 33/06* (2010.01)
*H01L 27/12* (2006.01)
*H01L 33/50* (2010.01)

(58) Field of Classification Search
CPC . H01L 27/322; H01L 27/5802; H01L 27/156;
H01L 27/1222; H01L 33/50; H01L 33/06;
H01L 33/501; H01L 33/502; H01L
33/504; H01L 33/507; H01L 51/52; H01L
51/5268; H01L 51/56; H01L 51/5203;
H01L 2933/0091; H01L 2933/0083;
H01L 2933/0058; H01L 2933/0066
See application file for complete search history.

(56) References Cited

U.S. PATENT DOCUMENTS

| | | | |
|---|---|---|---|
| 2007/0201056 A1* | 8/2007 | Cok | H01L 51/5268 358/1.9 |
| 2009/0207111 A1* | 8/2009 | Wang | G09F 9/33 345/83 |
| 2010/0219429 A1* | 9/2010 | Cok | H01L 51/5268 257/89 |
| 2011/0163318 A1 | 7/2011 | Park et al. | |
| 2018/0156951 A1* | 6/2018 | Baek | G02B 5/285 |

FOREIGN PATENT DOCUMENTS

| | | |
|---|---|---|
| CN | 107976835 A | 5/2018 |
| KR | 20140076284 A | 6/2014 |

* cited by examiner

DISPLAY PANEL

CROSS-REFERENCE TO RELATED APPLICATIONS

The present application is a continuation-application of international (PCT) Patent Application No. PCT/CN2019/084869, filed on Apr. 28, 2019, which claims foreign priority of Chinese Patent Application No. 201811013578.5, filed on Aug. 31, 2018 in the China National Intellectual Property Administration, the entire contents of which are hereby incorporated by reference.

FIELD

The described embodiments relate to a display technology, and more particularly, to a display panel.

BACKGROUND

With the development of science and technology, display panels have gradually become a necessity of people's lives and are the focus of research and development by major manufacturers.

Current display panels usually have a problem of uneven light emission. How to make the display panel to emit light more evenly to achieve a better display effect, is the focus of attention by major panel manufacturers.

SUMMARY

A technical problem mainly solved by the present disclosure is to provide a display panel which may increase uniformity of a pixel unit when light converted.

In order to solve the above-mentioned technical problem, a technical solution adopted by the present disclosure is to provide a display panel including a substrate; and a plurality of pixel units arranged on the substrate; wherein each of the plurality of pixel units includes a plurality of sub-pixel units including at least one first type of sub-pixel unit; each of the plurality of sub-pixel units includes a light emitting layer; the at least one first type of sub-pixel unit includes a first light processing layer; the first light processing layer includes at least a light diffusion material and a light conversion material mixed with each other; and the first light processing layer is located on a side of a light emitting surface of the light emitting layer at the at least one first type of sub-pixel unit.

In order to solve the above-mentioned technical problem, a technical solution adopted by the present disclosure is to provide a display panel, including: a substrate; and a pixel unit arranged on the substrate and including: a first type of sub-pixel unit including: a first light emitting layer arranged on the substrate; a first light processing layer arranged on the first light emitting layer and including: a transparent matrix; a first light diffusion material doped in the transparent matrix; and a light conversion material doped in the transparent matrix; a second type of sub-pixel unit including: a second light emitting layer arranged on the substrate; wherein the first light diffusion material and the light conversion material are mixed with each other.

In order to solve the above-mentioned technical problem, a technical solution adopted by the present disclosure is to provide a display panel, including: a substrate; and a pixel unit arranged on the substrate and including: a first type of sub-pixel unit including: a first light emitting layer arranged on the substrate; a first light processing layer arranged on the first light emitting layer and including: a first transparent matrix; a first light diffusion material doped in the first transparent matrix; and a light conversion material doped in the first transparent matrix; a second type of sub-pixel unit including: a second light emitting layer arranged on the substrate; a second light processing layer arranged on the second light emitting layer and including: a second transparent matrix; wherein the first light diffusion material and the light conversion material are mixed with each other; and a surface of the first light processing layer away from the substrate and a surface of the second light processing layer away from the substrate, are aligned.

In the present disclosure, a display panel including a substrate; and a plurality of pixel units arranged on the substrate; wherein each of the plurality of pixel units includes a plurality of sub-pixel units including at least one first type of sub-pixel unit; each of the plurality of sub-pixel units includes a light emitting layer; the at least one first type of sub-pixel unit includes a first light processing layer; the first light processing layer includes at least a light diffusion material and a light conversion material doped with each other; and the first light processing layer is located on a side of a light emitting surface of the light emitting layer at the at least one first type of sub-pixel unit. Since the light processing layer is provided with the light diffusion material and the light conversion material mixed with each other, the uniformity of light conversion by the light emitting layer may be improved, thereby the display effect of the display panel may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

Figure 1:
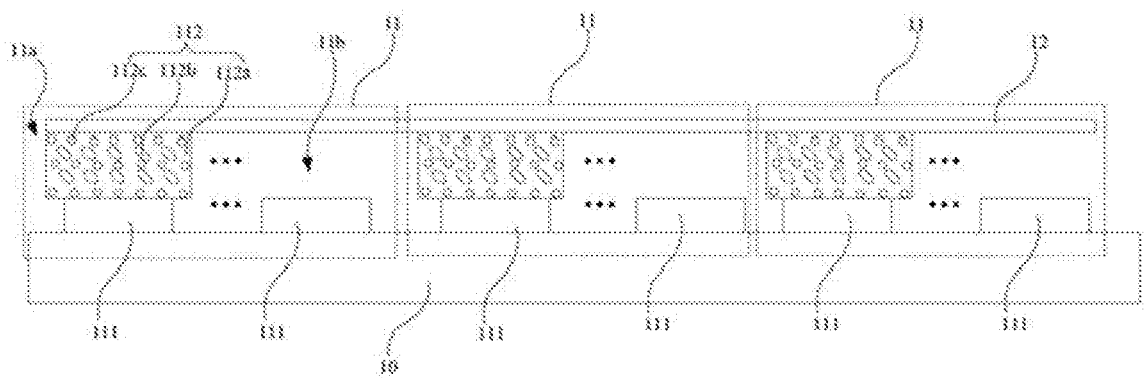
FIG. 1 is a structural illustration of a display panel in accordance with an embodiment in the present disclosure.

Referring to FIG. 1, FIG. 1 is a structural illustration of a display panel in accordance with an embodiment in the present disclosure. In this embodiment, the display panel may include a substrate 10, and a plurality of pixel units 11.

The substrate 10 may be a substrate made of a hard material, for example, a glass substrate, a plastic substrate, and so on. The substrate 10 may also be a substrate made of a soft material. It is not limited in this embodiment of the present disclosure.

The plurality of pixel units 11 may be arranged on the substrate 10 in an array.

Each of the plurality of pixel units 11 may include a plurality of sub-pixel units 11a and 11b. There are only two sub-pixel units 11a and 11b shown in FIG. 1, which are merely schematic, and it may actually include a plurality of sub-pixel units. For example, the plurality of sub-pixel units may include red, green, and blue sub-pixel units, or the plurality of sub-pixel units may also include red, green, blue, and white sub-pixel units. It is not limited in this embodiment of the present disclosure. The plurality of sub-pixel units 11a and 11b may be arranged side by side. The plurality of sub-pixel units 11a and 11b may display different colors by mixing light.

Each of the plurality of sub-pixel units 11a and 11b may include light emitting layers 111. The light emitting layers 111 of all of the plurality of sub-pixel units 11a and 11b may be arranged in an array on the substrate 10 to form a light emitting layer array.

At least one of the plurality of sub-pixel units 11a (i.e., a first type of sub-pixel unit 11a) may include a first light processing layer 112 in addition to the light emitting layer 11l.

The first light processing layer 112 may include a transparent matrix 112a, a light diffusion material 112b and a light conversion material 112c doped in the transparent matrix 112a. The light diffusion material 112b and the light conversion material 112c may be mixed with each other.

In at least one embodiment, the light diffusion material 112b may be uniformly distributed in the transparent matrix 112a, and the light conversion material 112c may be uniformly distributed in the transparent matrix 112a.

In at least one embodiment, the transparent matrix 112a may be a transparent resin, such as PMMA (polymethyl methacrylate). It should be understood that the transparent matrix 112a may be other materials. It is not limited in this embodiment of the present disclosure.

The light diffusion material 112b shown in FIG. 1 may be shown as an oval shape, and the light conversion material 112c may be shown as a circle shape, but it may be not actual shapes of the light diffusion material 112b and the light conversion material 112c. FIG. 1 is only for illustration, and it may be convenient to distinguish the light diffusion material 112b and the light conversion material 112c.

The light diffusion material 12b may be nano barium sulfate, calcium carbonate, silicon dioxide, and so on. The light diffusion material 112b may be distributed in a form of particles in the transparent matrix 112a. For example, the light diffusion material 112b may be a light diffusion particle.

The light diffusion material 112b is not limited to the above-mentioned materials, and may be other materials with a light diffusion function or a uniform light function.

The light conversion material 112c may be a quantum dot material. The light emitting layer 111 may emit excitation light to excite the quantum dot material to emit light with a corresponding color. The light conversion material 112c may be other materials with a color conversion function for excitation light. It is not limited in this embodiment of the present disclosure.

The first light processing layer 112 may be located on a side of a light emitting surface of the light emitting layer Ill at the at least one of the plurality of sub-pixel units 11a. In other words, the at least one of the plurality of sub-pixel units 11a may include the light emitting layer 111 and the first light processing layer 112 that are sequentially stacked on the substrate 10) along a light emitting direction of the display panel 10.

In at least one embodiment, the display panel 11 may further include a packaging film 12 arranged on a pixel unit array formed by the plurality of pixel units 11. The packaging film 12 may be arranged on a side of a light emitting surface of in the plurality of pixel units 11.

In this embodiment, at least another one of the plurality of sub-pixel units 11b (i.e., a second type of sub-pixel unit 11a) may only include the light emitting layer 111, and not include any light processing layers.

Figure 2:
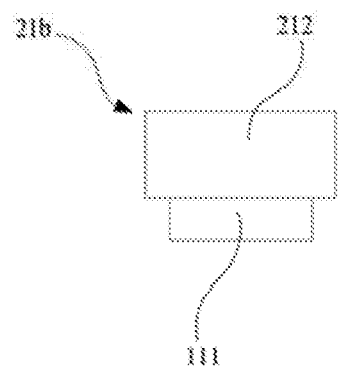
FIG. 2 is a structural illustration of a second type of sub-pixel unit in accordance with an embodiment in the present disclosure.

Referring to FIG. 2, FIG. 2 is a structural illustration of a second type of sub-pixel unit in accordance with an embodiment in the present disclosure. In this embodiment, at least another one of the plurality of sub-pixel units 21b (i.e., a second type of sub-pixel unit 21b) may include a second light processing layer 212 in addition to the light emitting layer 111. The second light processing layer 212 may be located on a side of a light emitting surface of the light emitting layer 111 at the at least another one of the plurality of sub-pixel units 21b.

The at least another one of the plurality of sub-pixel units 21b may emit light with a color same as light emitted by the light emitting layer 111. For example, a color of light emitted by the least another one of the plurality of sub-pixel units 21b may be blue, and an excitation light emitted by the light emitting layer ill may be also blue. Therefore, it may not be necessary to arrange a light conversion material to convert a color of an excitation light emitted by the light emitting layer 111. The second light processing layer 212 may not have a light conversion function. Specifically, the second light processing layer 212 may have cases as the following descriptions.

As shown in FIG. 2, in a first case, the second light processing layer 212 may include a transparent matrix and may not include a light diffusion material and a quantum dot material.

In at least one embodiment, a surface of the first light processing layer 112 away from the substrate 10 may be aligned with a surface of the second light processing layer 212 away from the substrate 10.

On one hand, since the first type of sub-pixel unit 11a may include a first light processing layer 112 and a transparent matrix 112a may be usually required in the first light processing layer 112, a second light processing layer 212 with only a transparent matrix may be arranged, in order to ensure uniform light emission of the first type of sub-pixel unit 11a and the second type of sub-pixel unit 11b. On the other hand, in order to ensure flatness of the light emitting surface of a pixel unit array and facilitate formation of the packaging film 12, a second light processing layer 212 with only a transparent matrix may be arranged.

Figure 3:
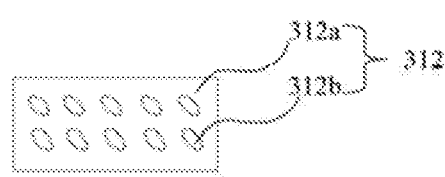
FIG. 3 is a structural illustration of a second light processing layer in accordance with an embodiment in the present disclosure.

Referring to FIG. 3, FIG. 3 is a structural illustration of a second light processing layer in accordance with an embodiment in the present disclosure. In a second case, the second light processing layer 312 may include a transparent matrix 312a and a light diffusion material 312b doped in the transparent matrix 312a. The second light processing layer 312 may not include a light conversion material.

Since the first type of sub-pixel unit 11a may include a light diffusion material 112b, in order to ensure uniform light emission of the second type of sub-pixel unit 21b and the first type of sub-pixel unit 11a, a light diffusion material 312b may be also arranged in the second light processing layer 312.

A width of the first light processing layer 112 may be larger than a width of the light emitting layer of the at least one of the plurality of sub-pixel units 11a. A width of the second light processing layer 212 or 312 may be larger than a width of the light emitting layer 111 of the at least another one of the plurality of sub-pixel units 11b. By the above-mentioned descriptions, light utilization ratio of the light processing layer to the light emitting layer may be improved. In at least one embodiment, the first type of sub-pixel unit 11*a* may include a first sub-pixel unit and a second sub-pixel unit. A light conversion material in the first sub-pixel unit 11*a* may be a quantum dot material emitting a first light converted color. A light conversion material in the second sub-pixel unit 11*b* may be a quantum dot material emitting a second light converted color. A color of light emitted by the light emitting layer may be different from the first light converted color and the second light converted color. The second type of sub-pixel unit may be a third sub-pixel unit. A color of light emitted by the third sub-pixel unit may be the color of light emitted by the light emitting layer. In at least one embodiment, the first light converted color may be red. The second light converted color may be green. The color of light emitted by the light emitting layer may be blue. The first sub-pixel unit may be a red sub-pixel unit. The second sub-pixel unit may be a green sub-pixel unit. The third sub-pixel unit may be a blue sub-pixel unit. A quantum dot material of the first light converted color may be a red quantum dot material. A quantum dot material of the second light converted color may be a green quantum dot material. For details, refer to descriptions of the following embodiment of the display panel.

Figure 4:
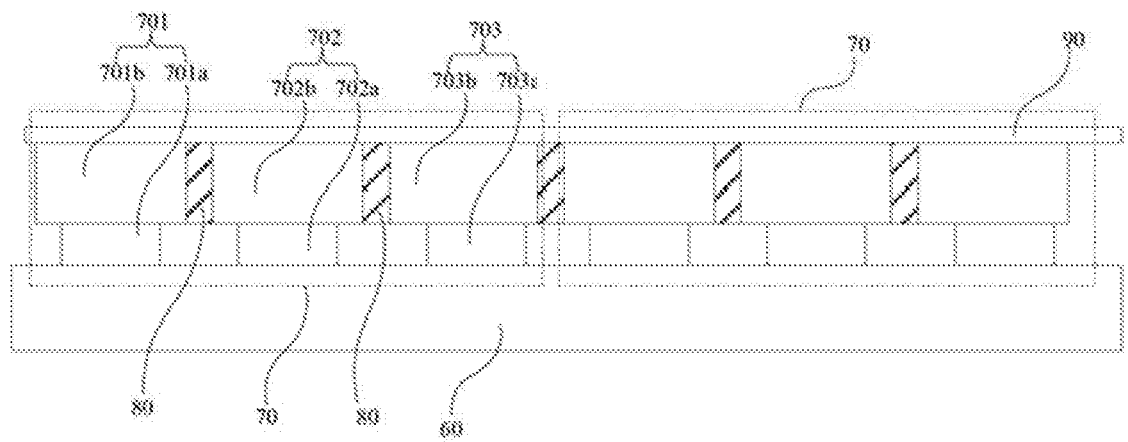
FIG. 4 is a structural illustration of a display panel in accordance with an embodiment in the present disclosure.

Referring to FIG. 4, FIG. 4 is a structural illustration of a display panel in accordance with an embodiment in the present disclosure. In this embodiment, the display panel may include a substrate 60, a plurality of pixel units 70, a black matrix 80, and a packaging film 90.

The substrate 60 may be a substrate made of a hard material, for example, a glass substrate. The substrate 60 may also be a substrate made of a soft material. It is not limited in this embodiment of the present disclosure.

The plurality of pixel units 70 may be arranged on the substrate 60 in an array.

In at least one embodiment, each of the plurality of pixel units 70 may include a plurality of sub-pixel units 701, 702, and 703. Specifically, the plurality of sub-pixel units 701, 702, and 703 may include a red sub-pixel unit 701, a green sub-pixel unit 702, and a blue sub-pixel unit 703.

In other embodiments, the plurality of sub-pixel units may also include a red sub-pixel unit, a green sub-pixel unit, a blue sub-pixel unit, and a white sub-pixel unit.

The red sub-pixel unit 701 may include a light emitting layer 701*a* and a first light processing layer 701*b* arranged away from the substrate 60 sequentially. The first light processing layer 701*b* may be located on a side of a light emitting surface of the light emitting layer 701*a*.

The green sub-pixel unit 702 may include a light emitting layer 702*a* and a first light processing layer 702*b* arranged away from the substrate 60 sequentially. The first light processing layer 702*b* may be located on a side of a light emitting surface of the light emitting layer 702*a*.

The blue sub-pixel unit 703 may include a light emitting layer 703*a* and a second light processing layer 703*b* arranged away from the substrate 60 sequentially. The second light processing layer 703*b* may be located on a side of a light emitting surface of the light emitting layer 703*a*.

The light emitting layers 701*a*, 702*a*, and 703*a* may emit light with a blue color. In other embodiments, the blue sub-pixel unit 703 may not include the second light processing layer 703*b*, and only the light emitting layer 703*a* may be arranged.

Structures of the first light processing layer 701*b* and the first light processing layer 702*b* may be similar, and may both include a transparent matrix, a light diffusion material and a light conversion material doped in the transparent matrix. The light diffusion material and the light conversion material may be mixed with each other. The light diffusion material may be uniformly distributed in the transparent matrix. The light conversion material may be uniformly distributed in the transparent matrix.

The light conversion material in the first light processing layer 701*b* may be a red quantum dot material. The light conversion material in the first light processing layer 702*b* may be a green quantum dot material.

In at least one embodiment, the second light processing layer 703*b* may include a transparent matrix and a light diffusion material doped in the transparent matrix.

In at least one embodiment, the red quantum dot material in the red sub-pixel unit 701 may be less than the green quantum dot material in the green sub-pixel unit 702.

Since blue light may be absorbed by green and red light and green light may be absorbed by red light, to arrange larger number of green quantum dot materials in the green sub-pixel unit 702 and a smaller number of red quantum dot materials in the red sub-pixel unit 701 may offset loss of green light and increase white light index of a display panel when white light is displayed, and life of the green sub-pixel unit 702 may be increased.

In at least one embodiment, the light diffusion material in the red sub-pixel unit 701 may be more than the light diffusion material in the green sub-pixel unit 702. The light diffusion material in the green sub-pixel unit 702 may be more than the light diffusion material in the blue sub-pixel unit 703.

Since the more light diffusion material and the stronger light diffusivity of a sub-pixel unit, light emitted by the sub-pixel unit may be more easily absorbed by other sub-pixel units around. Therefore, in order to reduce absorption of blue light by green light and red light and absorption of green light by red light, light diffusivity of the blue sub-pixel unit 703 may be arranged to minimum light diffusivity, and the green sub-pixel unit 702 may be arranged to light diffusivity stronger than the blue sub-pixel unit 703, and the red sub-pixel unit 703 may be arranged to strongest light diffusivity. It may reduce loss of blue light and green light, increase white light index of a display panel when white light is displayed, and life of the green sub-pixel unit 702 and the blue sub-pixel unit 703 may be increased.

In at least embodiment, a surface of the first light processing layer 701*b* away from the substrate 60, a surface of the first light processing layer 702*b* away from the substrate 60, and a surface of the second light processing layer 703*b* away from the substrate 60 may be aligned, so that each sub-pixel unit away from the substrate 60 may be flattened. It may facilitate a subsequent formation of the packaging film 90.

In at least embodiment, a width of the first light processing layer 701*b* may be larger than a width of the light emitting layer 701*a*, a width of the first light processing layer 702*b* may be larger than a width of the light emitting layer 702*a*, and a width of the second light processing layer 703*b* may be larger than a width of the light emitting layer 703*a*, so that the light processing layer may improve light utilization ratio of the light processing layer to the light emitting layer. In other embodiments, a width of the light processing layer may be equal to a width of the corresponding light emitting layer. It is not limited in this embodiment of the present disclosure.

In this embodiment, specific structures of the first light processing layers 701*b* and 702*b* and the second light processing layer 703*b* may be understood in combination with the descriptions in the above-mentioned embodiment, therefore additional description about other cases is given herein.

The black matrix 80 may be arranged between adjacent sub-pixel units. In at least one embodiment, the black matrix 80 may be arranged between adjacent light processing layers, and the black matrix 80 may be not arranged between adjacent light emitting layers. For example, the black matrix 80 may be arranged between the first light processing layer 701*b* and the first light processing layer 702*b*, and the black matrix 80 may be arranged between the first light processing layer 702*b* and the second light processing layer 703*b*. The black matrix 80 may be also arranged between two adjacent pixel units 70.

A main function of the black matrix 80 arranged between adjacent light processing layers may prevent crosstalk between different colors of light (red, green, and blue) due to different converted colors between adjacent sub-pixel units (light conversion materials). It may also have a function of shielding light and preventing crosstalk between two adjacent light emitting layers. It may be not necessary to arrange a black matrix between adjacent light emitting layers, and materials may be saved.

In order to improve a ability to prevent crosstalk between two adjacent light emitting layers, and to avoid that the black matrix 80 arranged only between the light processing layers cannot block the crosstalk between the adjacent light emitting layers, a black matrix may be also arranged between the adjacent light emitting layers to avoid crosstalk between the two adjacent light emitting layers. The crosstalk between the two adjacent light emitting layers may be avoided, and thus interference from the light emitting layer of the adjacent sub-pixel units when controlling a light emitting layer of corresponding sub-pixel units may be avoided, to improve display control accuracy, thereby display quality may be improved.

The packaging film 90 may be arranged on a side of a light emitting surface of the pixel unit 70. Specifically, the packaging film 90 may be arranged on a pixel unit array formed by the plurality of pixel units 70.

In any one of the embodiments in the present disclosure, a light emitting layer array with all light emitting layers may be formed on a substrate, and then a light processing layer (a first light processing layer or a second light processing layer) may be formed on a corresponding light emitting layer. On the one hand, it may simplify a manufacturing process. On the other hand, it may increase pixel density and improve fineness of display. The process of forming a light emitting layer on a substrate may be not limited to a mask process, and the process of forming a light processing layer on a light emitting layer may be not limited to a mask process or a spray printing process.

In the present disclosure, the display panel including the substrate; and the plurality of pixel units arranged on the substrate; wherein each of the plurality of pixel units includes a plurality of sub-pixel units including the at least one first type of sub-pixel unit; each of the plurality of sub-pixel units includes the light emitting layer; the at least one first type of sub-pixel unit includes the first light processing layer; the first light processing layer includes the at least the light diffusion material and the light conversion material doped with each other; and the first light processing layer is located on the side of the light emitting surface of the light emitting layer at the at least one first type of sub-pixel unit. Since the light processing layer is provided with the light diffusion material and the light conversion material mixed with each other, the uniformity of light conversion by the light emitting layer may be improved, thereby the display effect of the display panel may be improved.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A display panel comprising:
a substrate; and
a plurality of pixel units arranged on the substrate;
wherein each of the plurality of pixel units comprises a plurality of sub-pixel units comprising at least one first type of sub-pixel unit; each of the plurality of sub-pixel units comprises a light emitting layer; the at least one first type of sub-pixel unit comprises a first light processing layer; the first light processing layer comprises at least a light diffusion material and a light conversion material mixed with each other; and the first light processing layer is located on a side of a light emitting surface of the light emitting layer at the at least one first type of sub-pixel unit,
wherein the plurality of sub-pixel units further comprises at least one second type of sub-pixel unit; the at least one second type of sub-pixel unit comprises a second light processing layer without a light conversion function; and the second light processing layer is located on a side of a light emitting surface of the light emitting layer at the at least one second type of sub-pixel unit,
wherein the at least one first type of sub-pixel unit comprises a first sub-pixel unit and a second sub-pixel unit; a first light conversion material in the first sub-pixel unit is a first quantum dot material emitting a first light converted color, a second light conversion material in the second sub-pixel unit is a second quantum dot material emitting a second light converted color; a color of light emitted by the light emitting layer is different from the first light converted color and the second light converted color; the at least one second type of sub-pixel unit comprises a third sub-pixel unit; and a color of light emitted by the third sub-pixel unit is the color of light emitted by the light emitting layer,
wherein the first light converted color is red, the second light converted color is green, and the first quantum dot material is less in quantity than the second quantum dot material.

2. The display panel according to claim 1, wherein the light diffusion material is a light diffusion particle.

3. The display panel according to claim 1, wherein a surface of the first light processing layer away from the substrate is aligned with a surface of the second light processing layer away from the substrate.

4. The display panel according to claim 1, wherein a width of the first light processing layer is larger than a width of the light emitting layer of the at least one first type of sub-pixel unit; and a width of the second light processing layer is larger than a width of the light emitting layer of the at least one second type of sub-pixel unit.

5. The display panel according to claim 1, wherein the first light processing layer further comprises a transparent matrix; the light diffusion material is uniformly distributed in the transparent matrix; and the light conversion material is uniformly distributed in the transparent matrix.

6. The display panel according to claim 1, further comprising:
a packaging film arranged on a pixel unit array formed by the plurality of pixel units; wherein the packaging film is arranged on a side of a light emitting surface of the plurality of pixel units.

7. The display panel according to claim 1, further comprising:
a black matrix arranged between two first light processing layers of the adjacent plurality of sub-pixel units, or arranged between the adjacent first light processing layer and the second light processing layer.

8. The display panel according to claim 1, wherein the light diffusion material is selected from the group consisting of nanometer barium sulfate, calcium carbonate, and silicon dioxide.

9. The display panel according to claim 1, wherein a light diffusivity of the third sub-pixel unit is configured to be minimum among the first, second third sub-pixel units, and the light diffusivity of the first sub-pixel unit is configured to be maximum among the first, second third sub-pixel units.

10. The display panel according to claim 1, further comprising:
a black matrix arranged between adjacent two of the plurality of sub-pixel units.

11. The display panel according to claim 10, wherein the black matrix is arranged between two light emitting layers of the adjacent plurality of sub-pixel units.

12. The display panel according to claim 1, wherein the first light converted color is red; the second light converted color is green; and the light diffusion material in the first sub-pixel unit is a first light diffusion material; the light diffusion material in the second sub-pixel unit is a second light diffusion material; and the first light diffusion material is more in quantity than the second light diffusion material.

13. The display panel according to claim 12, wherein the second light processing layer of the third sub-pixel unit comprises a transparent matrix and a third light diffusion material doped in the transparent matrix.

14. The display panel according to claim 13, wherein the color of light emitted by the light emitting layer is blue; and the second light diffusion material is more in quantity than the third light diffusion material.

15. A display panel, comprising:
a substrate; and
a pixel unit arranged on the substrate and comprising:
a first type of sub-pixel unit comprising:
a first light emitting layer arranged on the substrate;
a first light processing layer arranged on the first light emitting layer and comprising:
a transparent matrix;
a first light diffusion material doped in the transparent matrix; and
a light conversion material doped in the transparent matrix;
a second type of sub-pixel unit comprising:
a second light emitting layer arranged on the substrate;
wherein the first light diffusion material and the light conversion material are mixed with each other,
wherein the first type of sub-pixel unit comprises a first sub-pixel unit and a second sub-pixel unit a first light conversion material in the first sub-pixel unit is a first quantum dot material emitting a first light converted color, a second light conversion material in the second sub-pixel unit is a second quantum dot material emitting a second light converted color; a color of light emitted by the light emitting layer is different from the first light converted color and the second light converted color; the second type of sub-pixel unit comprises a third sub-pixel unit and a color of light emitted by the third sub-pixel unit is the color of light emitted by the light emitting layer,
wherein the first light converted color is red, the second light converted color is green, and the first quantum dot material is less in quantity than the second quantum dot material.

16. The display panel according to claim 15, wherein a width of the first light processing layer is larger than a width of the first light emitting layer.

17. A display panel, comprising:
a substrate; and
a pixel unit arranged on the substrate and comprising:
a first type of sub-pixel unit comprising:
a first light emitting layer arranged on the substrate;
a first light processing layer arranged on the first light emitting layer and comprising:
a first transparent matrix;
a first light diffusion material doped in the first transparent matrix; and
a light conversion material doped in the first transparent matrix;
a second type of sub-pixel unit comprising:
a second light emitting layer arranged on the substrate;
a second light processing layer arranged on the second light emitting layer and comprising:
a second transparent matrix;
wherein the first light diffusion material and the light conversion material are mixed with each other; and a surface of the first light processing layer away from the substrate and a surface of the second light processing layer away from the substrate, are aligned,
wherein the second light processing layer is located on a side of a light emitting surface of the light emitting layer at the second type of sub-pixel unit,
wherein the first type of sub-pixel unit comprises a first sub-pixel unit and a second sub-pixel unit; a first light conversion material in the first sub-pixel unit is a first quantum dot material emitting a first light converted color, a second light conversion material in the second sub-pixel unit is a second quantum dot material emitting a second light converted color; a color of light emitted by the light emitting layer is different from the first light converted color and the second light converted color; the second type of sub-pixel unit comprises a third sub-pixel unit and a color of light emitted by the third sub-pixel unit is the color of light emitted by the light emitting layer,
wherein the first light converted color is red, the second light converted color is green, and the first quantum dot material is less in quantity than the second quantum dot material.

18. The display panel according to claim 17, wherein the second light processing layer further comprises a second light diffusion material doped in the second transparent matrix.

* * * * *